(12) United States Patent
Suzuki et al.

(10) Patent No.: US 7,470,893 B2
(45) Date of Patent: Dec. 30, 2008

(54) PHOTO-DETECTION DEVICE

(75) Inventors: Yasuhiro Suzuki, Hamamatsu (JP);
Seiichiro Mizuno, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 70 days.

(21) Appl. No.: 10/557,547

(22) PCT Filed: May 21, 2004

(86) PCT No.: PCT/JP2004/007332

§ 371 (c)(1),
(2), (4) Date: Oct. 13, 2006

(87) PCT Pub. No.: WO2004/105137

PCT Pub. Date: Dec. 2, 2004

(65) Prior Publication Data

US 2007/0181780 A1    Aug. 9, 2007

(30) Foreign Application Priority Data

May 23, 2003  (JP) ............................. 2003-146663

(51) Int. Cl.
*H01L 31/00*    (2006.01)
(52) U.S. Cl. ............... 250/239; 250/208.1; 257/432; 257/737
(58) Field of Classification Search ................. 250/239, 250/208.1; 257/432–434, 680, 737, 738, 257/780, 787, 698; 438/57, 60, 116, 106, 438/108

See application file for complete search history.

(56) References Cited

U.S. PATENT DOCUMENTS

| 5,043,582 A | 8/1991 | Cox et al. |
| 6,510,195 B1 * | 1/2003 | Chappo et al. ................ 378/19 |
| 2003/0218120 A1 * | 11/2003 | Shibayama .............. 250/214.1 |

FOREIGN PATENT DOCUMENTS

| EP | 1 207 559 A2 | 5/2002 |
| EP | 1 492 168 | 12/2004 |
| JP | 05-315578 | 11/1993 |

(Continued)

*Primary Examiner*—Georgia Y Epps
*Assistant Examiner*—Tony Ko
(74) *Attorney, Agent, or Firm*—Drinker Biddle & Reath LLP

(57) ABSTRACT

The present invention relates to a photo-detecting apparatus having a structure which can accurately detect light by restraining noises from occurring. The photo-detecting apparatus comprises a first substrate having a surface provided with M×N photodiodes and switches; a second substrate having a surface provided with signal processing parts for processing output signals of the photodiodes; and a third substrate arranged between the first and second substrates. The third substrate has a first surface opposing the first substrate and a second surface opposing the second substrate. In the third substrate, M common wires for connecting the photodiodes to the signal processing parts are arranged on the first surface, whereas bonding pads connected to the respective common wires are arranged on the second surface. The photodiodes on the first substrate are electrically connected to their corresponding common wires in the third substrate by way of first bumps, whereas the signal processing parts on the second substrate are electrically connected to their corresponding bonding pads in the third substrate by way of second bumps.

3 Claims, 12 Drawing Sheets

FOREIGN PATENT DOCUMENTS

| | | |
|---|---|---|
| JP | 11-261044 | 9/1999 |
| JP | 2001-242253 | 9/2001 |
| JP | 2001-291877 | 10/2001 |
| JP | 2001-339057 | 12/2001 |
| JP | 2002-311146 | 10/2002 |
| JP | 2003-264280 | 9/2003 |
| JP | 2003-282849 | 10/2003 |
| WO | WO 02/12845 A1 | 2/2002 |
| WO | WO 02/054955 | 7/2002 |
| WO | WO 03/019659 | 3/2003 |
| WO | WO 03/041174 | 5/2003 |
| WO | WO 03/077318 | 9/2003 |

* cited by examiner

PHOTO-DETECTION DEVICE

TECHNICAL FIELD

The present invention relates to a photo-detecting apparatus comprising a plurality of photodiodes (photodetector devices) arranged one- or two-dimensionally.

BACKGROUND ART

A photo-detecting apparatus is an apparatus comprising a plurality of photodiodes arranged one- or two-dimensionally, and an integrating circuit including an amplifier and a capacitor. In this kind of photo-detecting apparatus, the photodiodes output respective electric charges corresponding to their incident light intensities. The capacitor accumulates thus outputted electric charges, whereas the integrating circuit outputs voltages corresponding to thus accumulated electric charges. In accordance with the output voltages of the integrating circuit, the photo-detecting apparatus detects incident light at photosensitive regions corresponding to positions where the photodiodes are arranged.

Known as an example of this kind of photo-detecting apparatus is one disclosed in Japanese Patent Application Laid-Open No. 2001-242253 (Document 1). In the photo-detecting apparatus disclosed in Document 1, one integrating circuit is provided for a plurality of photodiodes, whereas switches are provided between an input terminal of the integrating circuit and the respective photodiodes. The photodiodes are disposed on a first substrate, whereas the integrating circuit is disposed on a second substrate. Respective end parts of the first and second substrates are electrically connected to each other by wire bonding.

DISCLOSURE OF THE INVENTION

The inventors have studied conventional optical communication systems in detail, and as a result, have found problems as follows. Namely, in the conventional photo-detecting apparatus disclosed in the above-mentioned Document 1, a path for electric charges to migrate from each photodiode to the input terminal of the integrating circuit is long. That is, this path includes a line from each photodiode to the end part of the first substrate, a bonding wire from the end part of the first substrate to the end part of the second substrate, and a line from the end part of the second substrate to the input terminal of the integrating circuit, thus yielding a long total path length. Therefore, this path exhibits a large parasitic capacitance. As a consequence, the conventional photo-detecting apparatus incurs a large noise included in the voltage outputted from the integrating circuit, thus failing to detect light accurately.

In order to overcome the above-mentioned problems, it is an object of the present invention to provide a photo-detecting apparatus having a structure which can accurately detect light by restraining noises from occurring.

For achieving the above-mentioned object, the present invention comprises a first substrate having a surface provided with a plurality of photodetector devices, a second substrate having a surface provided with a signal processing part for processing output signals of the photodetector devices, and a third substrate for electrically connecting the first and second substrates to each other. In particular, the third substrate is arranged between the first and second substrates, and includes a first surface opposing the first substrate and a second surface opposing the second substrate. A common wire, electrically connected to the photodetector devices, is disposed on the first surface, whereas a terminal part, electrically connected to the common wire on the first surface and the signal processing part, is disposed on the second surface.

Since the third substrate, including a common wire for connecting the photodetector devices to the signal processing part, is disposed between the first and second substrates, the photo-detecting apparatus according to the present invention can effectively reduce the length of wiring on the first or second substrate. Preferably, in this case, the photodetector devices are electrically connected to the common wire by way of a first bump disposed between the first and third substrates, whereas the signal processing part is electrically connected to the terminal part by way of a second bump disposed between the second and third substrates.

Since the wiring structure mentioned above connects the first, second, and third substrates by way of bumps, electric charge migration paths from the respective photodetector devices to the signal processing part are shortened, whereby the parasitic capacitance in the wiring on the paths decreases.

In the photo-detecting apparatus according to the present invention, the third substrate preferably has a structure such that an inner wire for connecting the common wire to the terminal part is buried within a ceramic substrate.

This is because, when the third substrate has a structure in which the inner wire is disposed within a ceramic substrate which is excellent in insulation, a plurality of inner wires if any can electrically be separated from each other.

In the photo-detecting apparatus according to the present invention, it is preferable that the common wire on the first surface of the third substrate includes a plurality of wiring elements arranged at a predetermined interval, whereas the terminal part on the second surface of the third substrate includes a plurality of terminals arranged at an interval narrower than the interval at which the plurality of wiring elements are arranged. Thus narrowing the interval at which the terminals included in the terminal part are arranged can reduce the size of the second substrate itself, thereby making it possible to position the second substrate on the inner side of the outer periphery of the third substrate.

In the photo-detecting apparatus according to the present invention, the first substrate may further comprise a plurality of switches electrically connected to the respective photodetector devices, and a control part for successively opening/closing the switches. When the control part thus regulates the opening/closing of the switches, generated electric charges can successively be outputted from a plurality of photodetector devices.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BEST MODES FOR CARRYING OUT THE INVENTION

In the following, embodiments of the photo-detecting apparatus according to the present invention will be explained in detail. with reference to FIGS. 1 to 12. In the explanation of the drawings, constituents identical to each other will be referred to with numerals identical to each other without repeating their overlapping descriptions.

Figure 2:
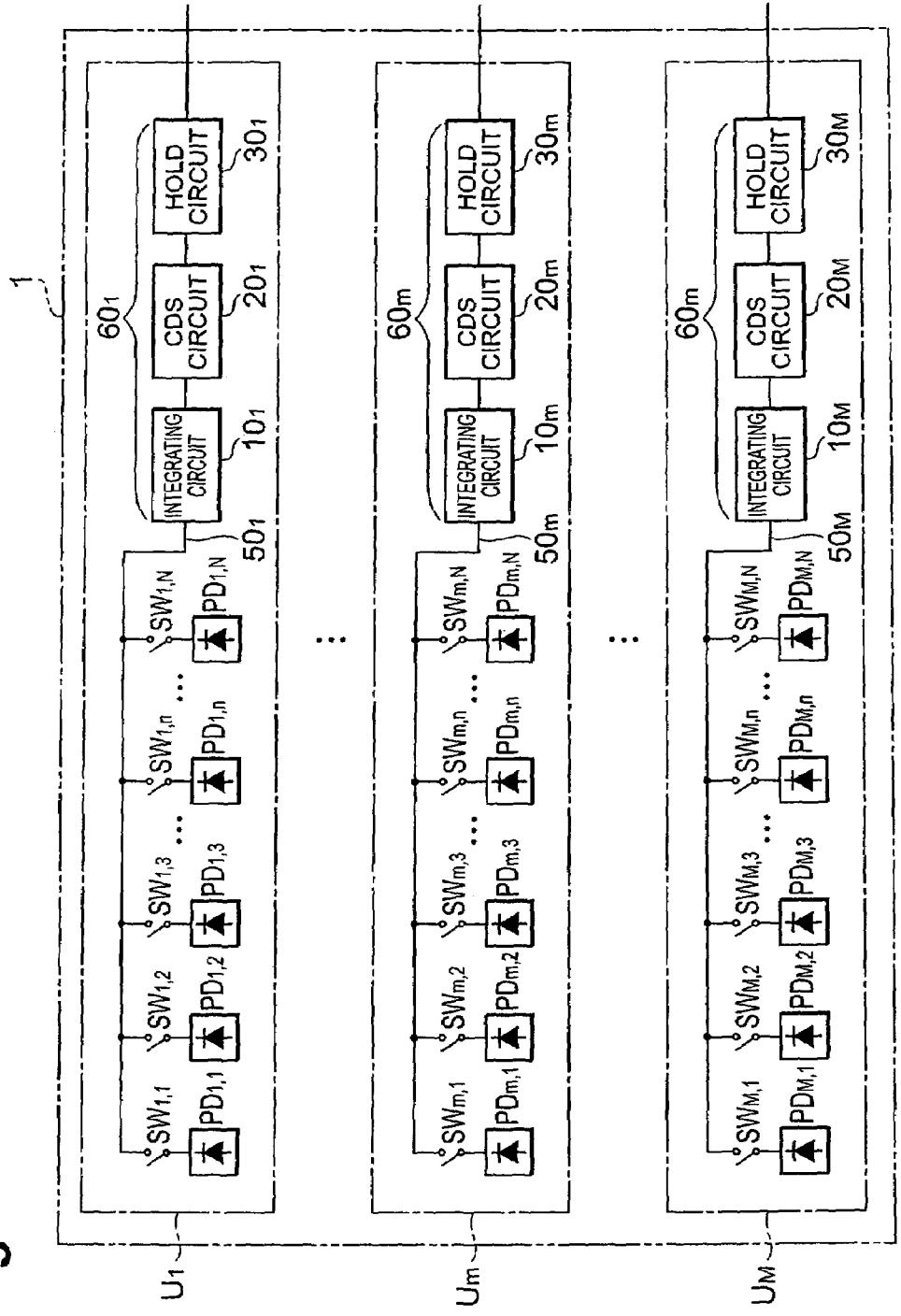
FIG. 2 is a logical block diagram of the photo-detecting apparatus shown in FIG. 1.
Figure 3:
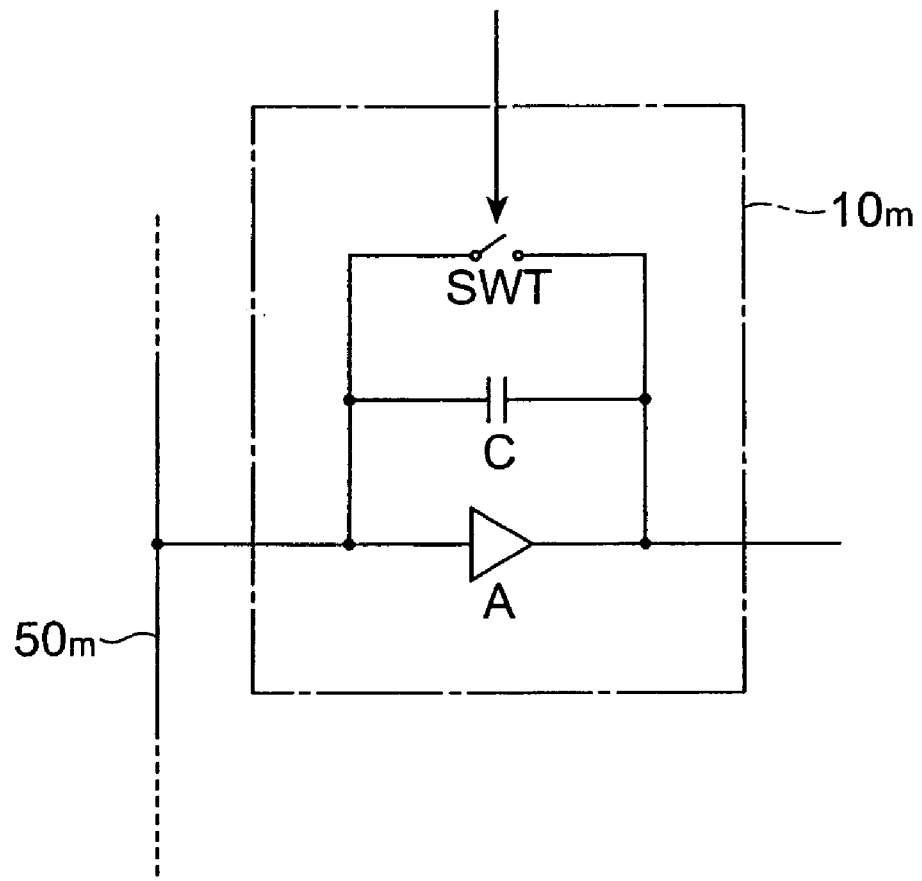
FIG. 3 is a circuit diagram showing the configuration of an integrating circuit in the photo-detecting apparatus shown in FIG. 1.

To begin with, an embodiment of the photo-detecting apparatus according to the present invention will be explained with reference to FIGS. 2 to 4. FIG. 2 is a view showing the configuration of an embodiment of the photo-detecting apparatus according to the present invention. The photo-detecting apparatus 1 shown in FIG. 2 comprises M photo-detecting units (hereinafter referred to as units) $U_1$ to $U_M$. Each unit $U_m$ includes N photodiodes $PD_{m,1}$ to $PD_{m,N}$, N switches $SW_{m,1}$ to $SW_{m,N}$, and a signal processing circuit $60_m$. Here, M is an integer of at least 1, whereas N is an integer of at least 2. On the other hand, m is an integer of at least 1 but not greater than M. Further, in the following, n is an integer of at least 1 but not greater than N.

The photodiodes $PD_{m,n}$ provided in each unit $U_m$ are photodetector devices which generate electric charges corresponding to their incident light intensities. The switches $SW_{m,n}$ are provided by M×N so as to correspond to the respective photodiodes $PD_{m,n}$, and each have first and second ends which can electrically be separated from/connected to each other as the switches are opened/closed. The first terminal is connected to its corresponding photodiode $PD_{m,n}$, whereas the second terminal is connected to an integrating circuit $10_m$ of the signal processing circuit $60_m$ by way of a common wire $50_m$.

M common wires $50_m$ are provided so as to correspond to the respective units $U_m$. Each common wire $50_m$ has one end connected to the respective second ends of the N switches $SW_{m,1}$ to $SW_{m,N}$, and the other end connected to the integrating circuit $10_m$ of the signal processing circuit $60_m$. The common wire $50_m$ commonly connects the photodiodes $PD_m$ to one integrating circuit $10_m$.

M signal processing circuits $60_m$ are provided so as to correspond to the respective units $U_m$. Each signal processing circuit $60_m$, which is a circuit for processing output signals of the photodiodes $PD_{m,n}$ provided in its corresponding unit $U_m$, comprises an integrating circuit $10_m$, a CDS (Correlated Double Sampling) circuit $20_m$, and a sample and hold circuit (hereinafter referred to as hold circuit) $30_m$.

The integrating circuit $10_m$ is connected to its corresponding common wire $50_m$ and CDS circuit $20_m$. As shown in FIG. 3, each integrating circuit $10_m$ comprises an amplifier A, a capacitor C, and a switch SWT which are connected in parallel. When the switch SWT is closed, the capacitor C discharges its accumulated electric charges, thereby initializing its output voltage. When the switch SWT is open, on the other hand, the capacitor C accumulates electric charges fed from the common wire $50_m$, whereby a voltage corresponding to the electric charges accumulated in the capacitor C is outputted.

The CDS circuit $20_m$ is connected between the integrating circuit $10_m$ and the hold circuit $30_m$. The CDS circuit $20_m$ inputs the output voltage 10 from the integrating circuit $10_m$, and outputs a voltage indicative of the change in thus inputted voltage in a fixed time to the hold circuit $30_m$. The hold circuit $30_m$ inputs the output voltage from the CDS circuit $20_m$ and holds this voltage for a predetermined period.

A control circuit 40 is control means for regulating operations of the photo-detecting apparatus 1 as a whole. As shown in FIG. 4, one control circuit 40 is provided for the photo-detecting apparatus 1. For all the units $U_1$ to $U_M$, the control circuit 40 regulates M×N switches $SW_{1,1}$ to $SW_{M,N}$, which are provided in their corresponding units $U_m$, so as to make them open/close successively. This opening/closing control operation sequentially connects the N photodiodes $PD_{m,1}$ to $PD_{m,N}$ to the integrating circuit $10_m$ one by one in the order of $PD_{m,1}$, $PD_{m,2}$, . . . , and $PD_{m,N}$, whereby the photodiodes $PD_{m,n}$ successively output their generated electric charges. The control circuit 40 also regulates the opening/closing of the respective switches SWT included in the integrating circuits $10_m$, thereby controlling timings for initializing and integrating operations in the integrating circuits $10_m$. The control circuit 40 further regulates timings at which the CDS circuits $20_m$ and hold circuits $30_m$ operate.

Figure 1:
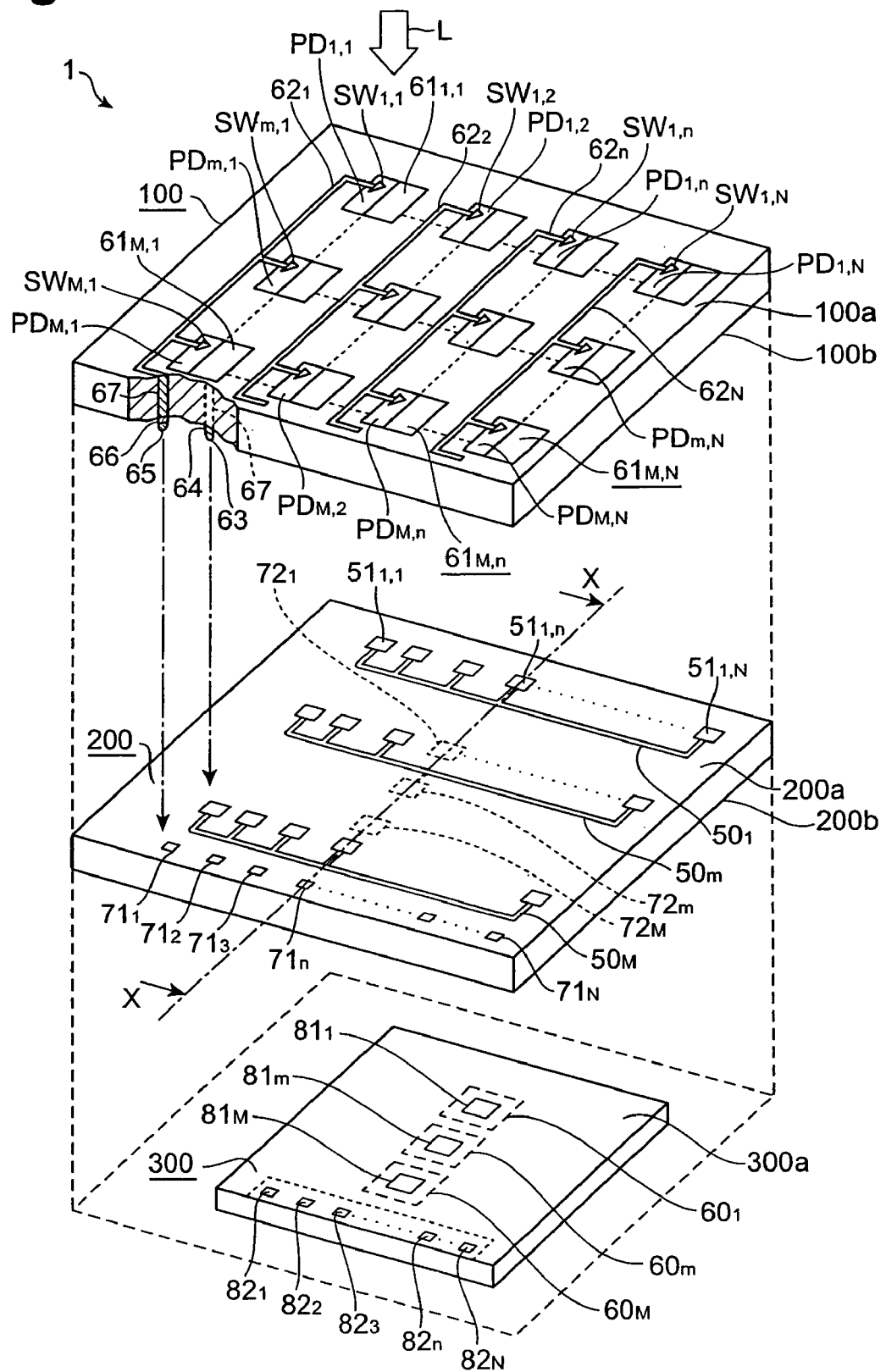
FIG. 1 is a perspective view showing the configuration of an embodiment of the photo-detecting apparatus according to the present invention.
Figure 4:
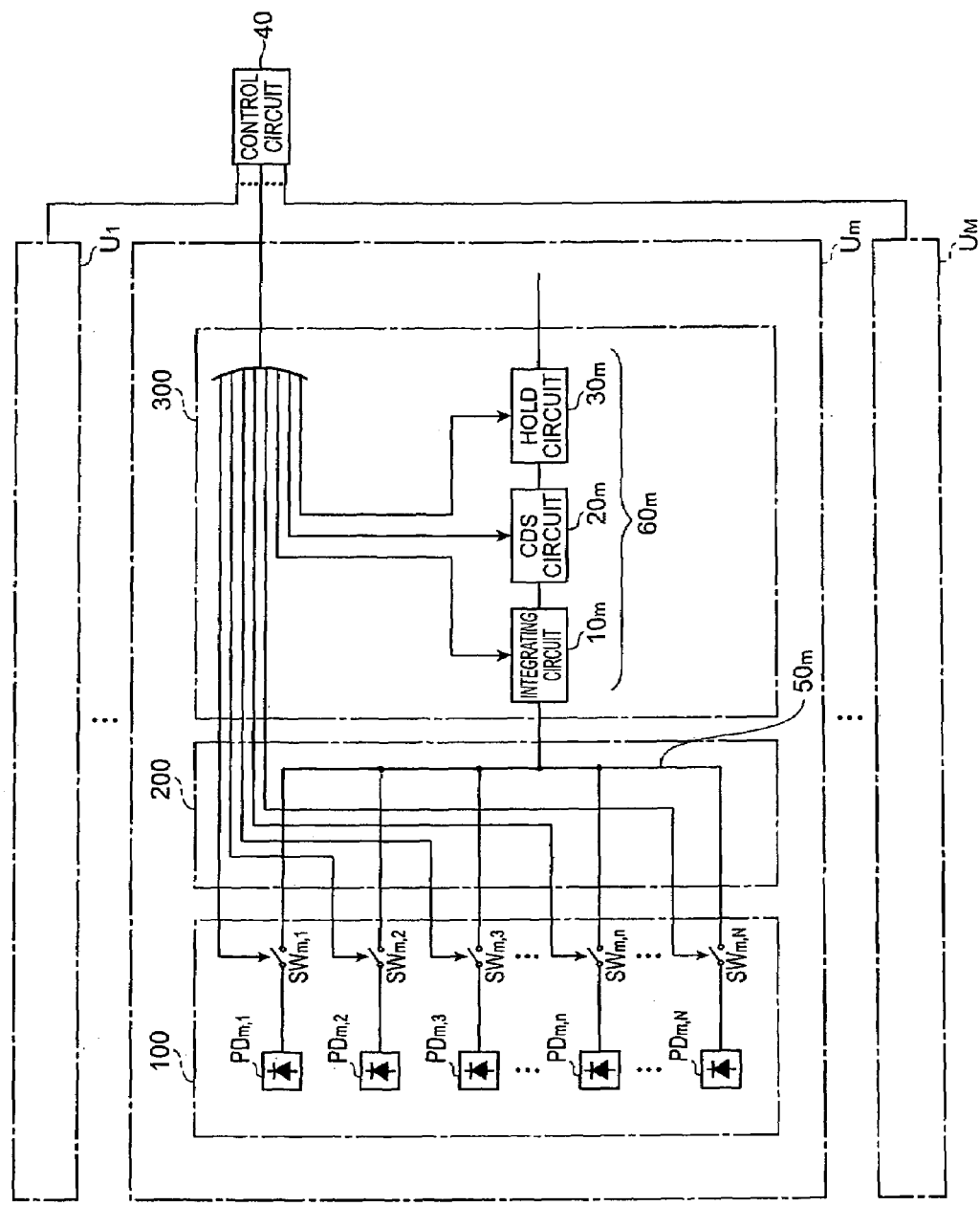
FIG. 4 is a logical block diagram showing the configuration of a unit $U_m$ and a control circuit which are included in the photo-detecting apparatus shown in FIG. 1.

Thus configured photo-detecting apparatus 1 is constituted by a substrate 100 (first substrate), a substrate 200 (third substrate), and a substrate 300 (second substrate) (see FIGS. 1 and 4). The substrate 100 is disposed on the upper side of the substrate 200, whereas the substrate 300 is disposed on the rear side, thus realizing a three-dimensional mounting structure in which the substrates 100, 200, and 300 are successively arranged in the light incident direction L.

While the substrates 100 and 200 have the same size in directions perpendicular to the thickness direction, i.e., their outer peripheries have the same size, the outer periphery of the substrate 300 has a size smaller than that of the outer periphery of the substrate 200 and is positioned on the inside of the outer periphery of the substrate 200 (the outer periphery of the substrate 300 may coincide with that of the substrate 200).

Figure 5:
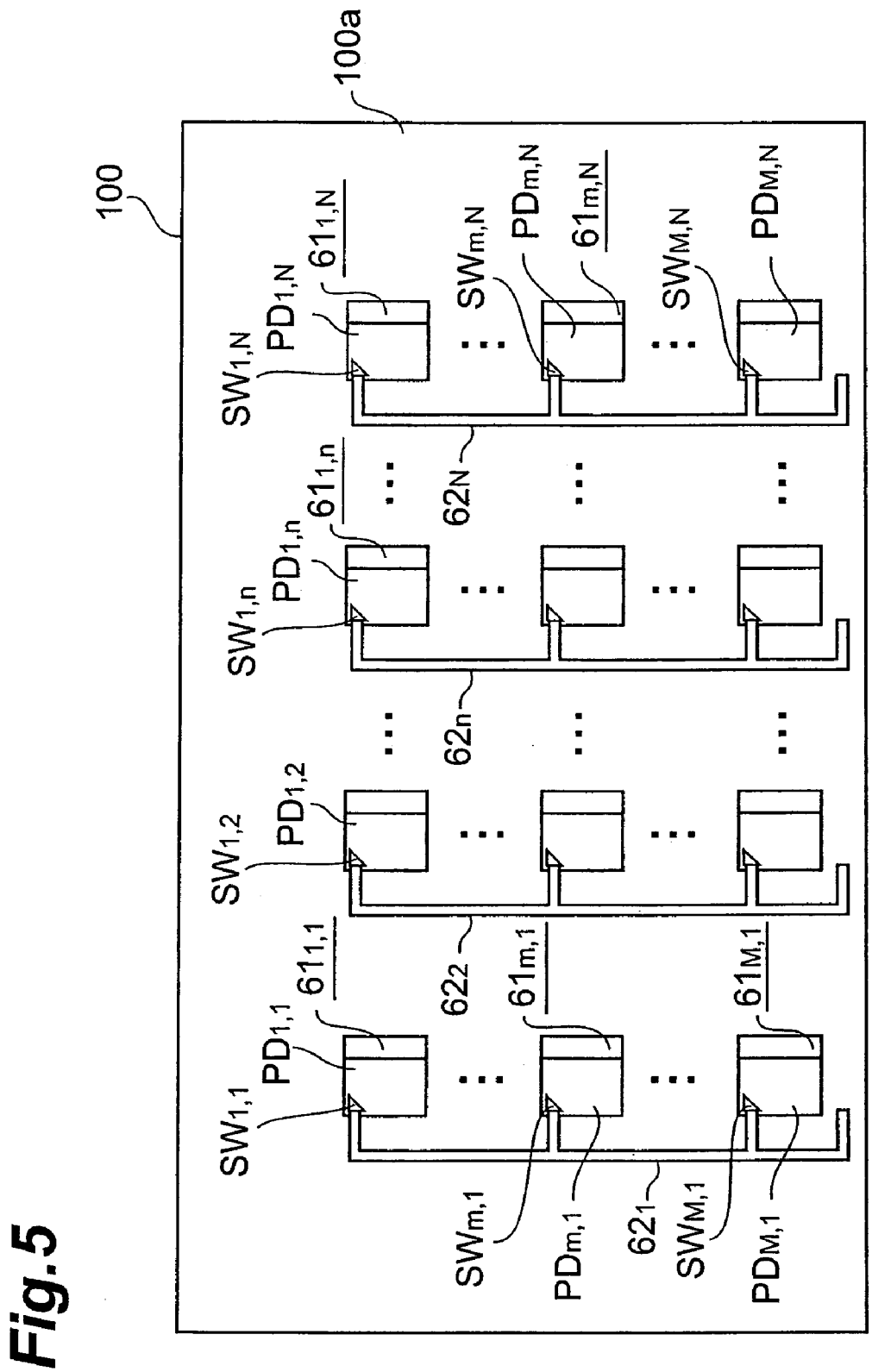
FIG. 5 is a plan view showing the configuration of a first substrate in the photo-detecting apparatus shown in FIG. 1.

The substrate 100 (first substrate) is a first substrate including a silicon substrate, on which M×N photodiodes $PD_{1,1}$ to $PD_{M,N}$ and M×N switches $SW_{1,1}$ to $SW_{M,N}$ constituting all the units $U_1$ to $U_M$ are provided. As shown in FIG. 5, on the side of a surface 100a on which the light L is incident (light-incident surface), the substrate 100 includes a PD array in which pixels each composed of a photodiode $PD_{m,n}$ and its corresponding switch $SW_{m,n}$ are arranged two-dimensionally in a matrix of M×N (M rows×N columns). On the first surface 100a side, the substrate 100 also includes M×N metal wires $61_{1,1}$ to $61_{M,N}$ connected to the respective photodiodes $PD_{m,n}$, and N metal wires $62_1$ to $62_N$ each commonly connected to M switches $SW_{1,n}$ to $SW_{M,n}$ in the first to Nth columns.

As shown in FIG. 1, M×N bonding pads 64 disposed so as to correspond to the respective photodiodes $PD_{m,n}$, and N bonding pads 66 provided so as to correspond to the respective metal wires $62_n$ are arranged on the side (second surface 100b side) opposite from the first surface 100a in the substrate 100. The substrate 100 further includes through wires 67 in M×N through holes penetrating therethrough from the first surface 100a to the second surface 100b so as to correspond to the respective photodiodes $PD_{m,n}$. Each through wire 67 has one end connected to its corresponding metal wire $61_{m,n}$ and the other end connected to its corresponding bonding pad 64. Also, one end of the through wire 67 is connected to its corresponding metal wire $62_n$, whereas the other end is connected to its corresponding bonding pad 66. For convenience of illustration, the bonding pads 64, 66 and through wires 67 (bumps 63, 65 which will be explained later) are represented by those corresponding to the photodiode $PD_{M,1}$ or metal wire $62_1$ while omitting the rest.

Figure 6:
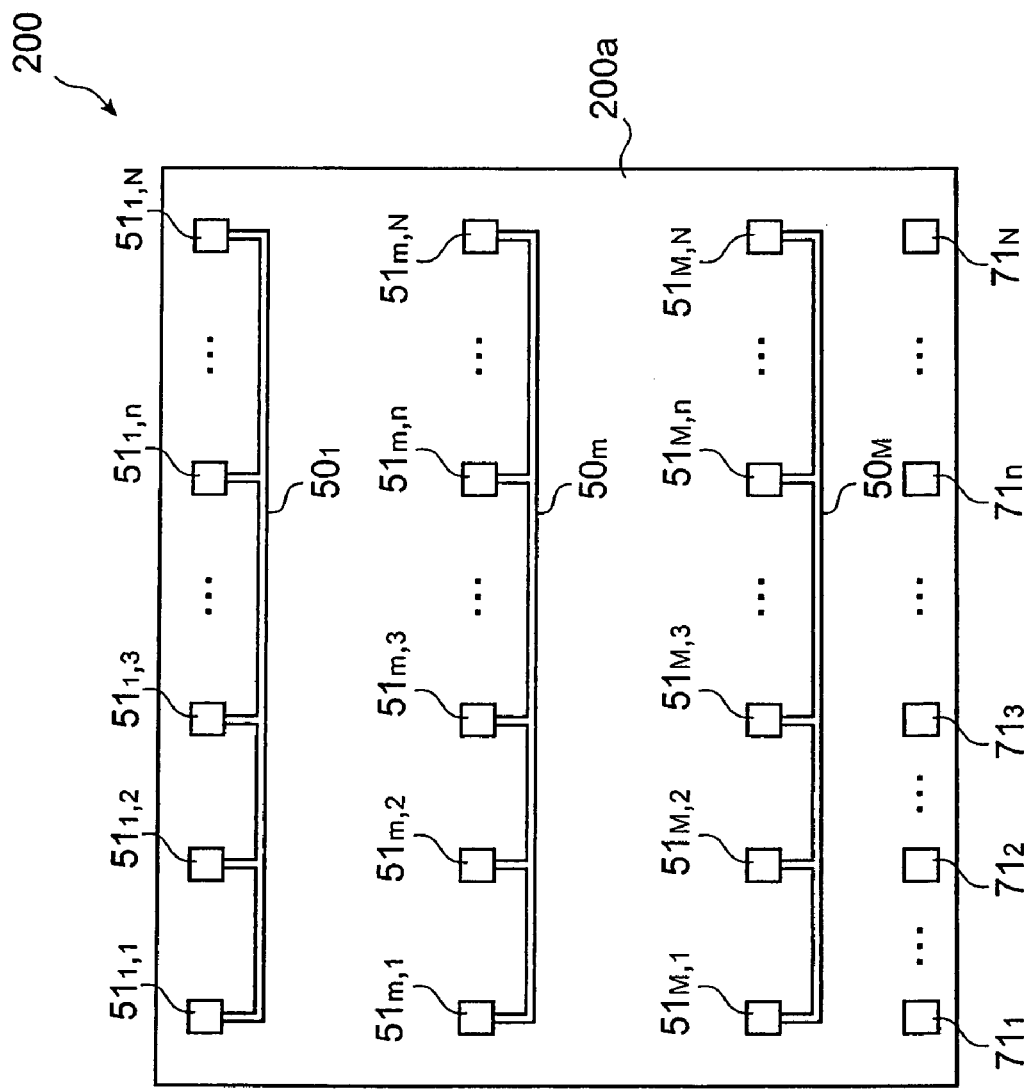
FIG. 6 is a plan view showing the configuration of the upper face (first surface opposing the first substrate) of a third substrate in the photo-detecting apparatus shown in FIG. 1.
Figure 7:
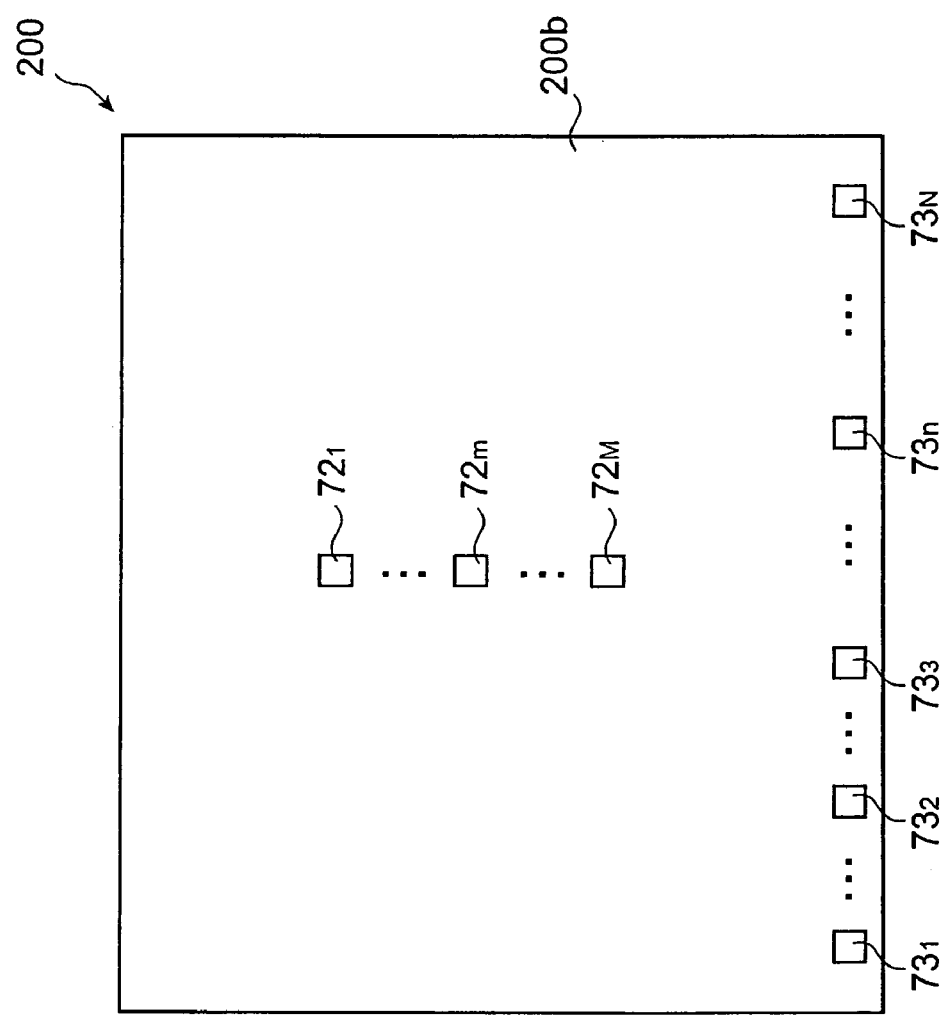
FIG. 7 is a plan view showing the configuration of the rear face (second surface opposing the second substrate) of the third substrate in the photo-detecting apparatus shown in FIG. 1 as seen from the upper face side.

The substrate 200 (third substrate) is a third substrate made of ceramic, for example, and has a wiring structure for electrically connecting the photodiodes $PD_{m,n}$ to their corresponding signal processing circuits $60_m$. As shown in FIG. 6, M common wires $50_1$ to $50_M$ provided so as to correspond to the respective units $U_m$ and N bonding pads $71_1$ to $71_N$ for inputting SW opening/closing signals to M×N switches $SW_{1,1}$ to $SW_{M,N}$ in the substrate 100 are disposed on the first surface 200a (upper face) side of the substrate 200 opposing the substrate 100. Each common wire $50_m$ comprises N bonding pads $51_{m,1}$ to $51_{m,N}$ to be electrically connected to the N photodiodes $PD_{m,1}$ to $PD_{m,N}$ provided in its corresponding unit $U_m$. As shown in FIG. 7, M bonding pads $72_1$ to $72_M$ as terminal parts provided so as to correspond to the respective units $U_m$ and N bonding pads $73_1$ to $73_N$ connected to their corresponding bonding pads $71_n$ are arranged on the second surface 200b (rear face) side of the substrate 200 opposing the substrate 300. FIG. 7 shows the configuration of the rear face of the third substrate as seen from the upper face (first surface 200a) side.

The substrate 300 (second substrate) is a silicon substrate, which is provided with M signal processing circuits $60_1$ to $60_M$ disposed so as to correspond to the respective units $U_m$ and one control circuit 40 (not depicted in FIG. 1). M bonding pads $81_1$ to $81_M$ provided so as to correspond to the respective bonding pads $72_m$ of the substrate 200 and N bonding pads $82_1$ to $82_N$ provided so as to correspond to the respective bonding pads $73_n$ of the substrate 200 are arranged on the first surface 300a side to be connected to the substrate 200. Connected to the bonding pads $81_m$ are their corresponding integrating circuits $10_m$ of the signal processing circuits $60_m$. The control circuit 40 is connected to the N bonding pads $82_n$.

Electric connection structures of the substrates 100, 200, and 300 will now be explained in detail with reference to sectional views shown in FIGS. 8 and 10 together with FIG. 1.

Figure 8:
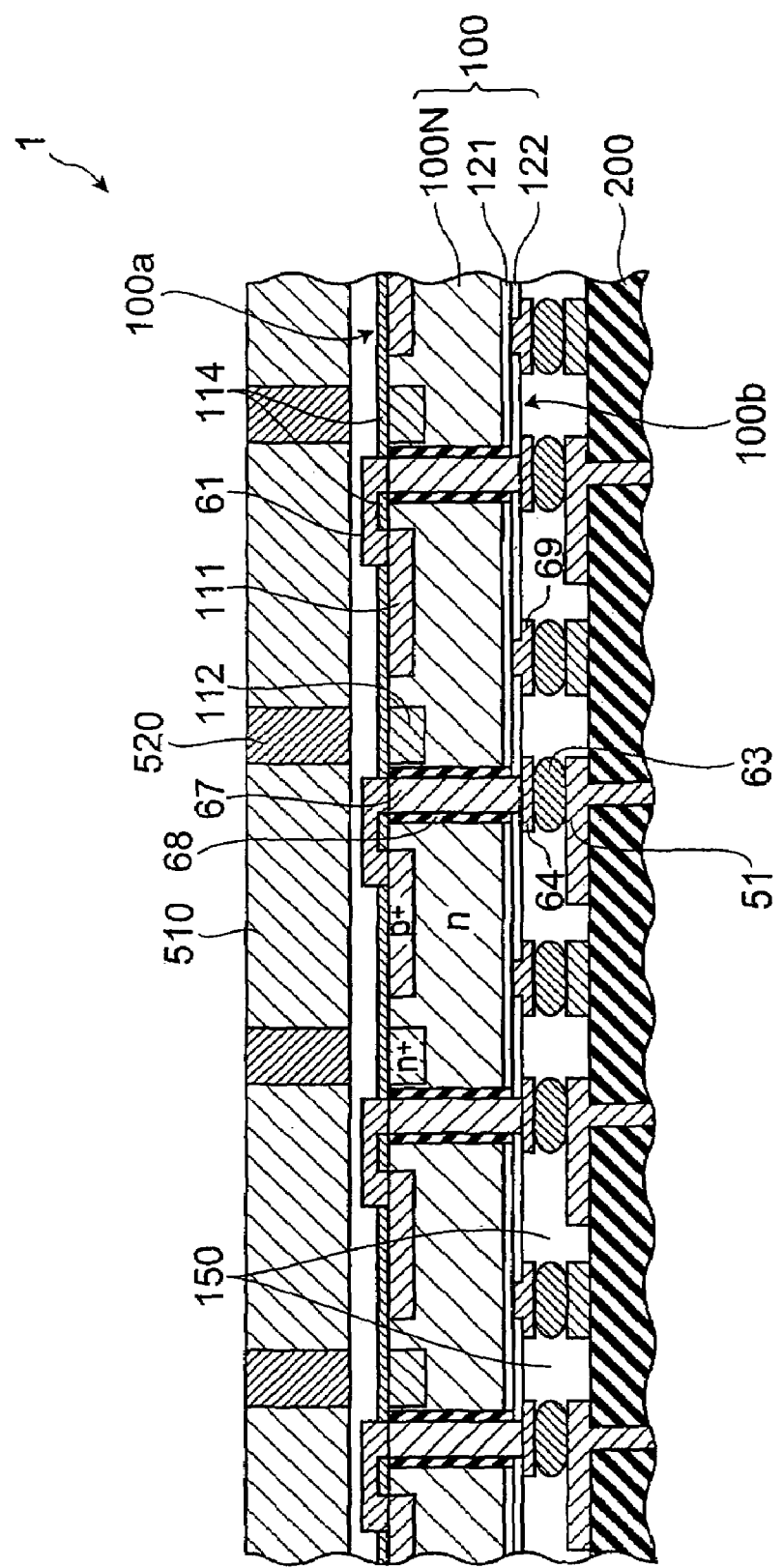
FIG. 8 is a view showing a first cross-sectional structure between the first and third substrates in the photo-detecting apparatus shown in FIG. 1 (first example)

FIG. 8 is a view showing a first cross-sectional structure of the substrates 100 and 200, which are the first and third substrates, respectively, as a first example of the photo-detecting apparatus according to the present invention. Since a basic pattern is laterally repeated in the photo-detecting apparatus 1 according to the first example, only this one basic pattern will be explained in the following.

In the substrate 100, $p^+$ regions 111, each constituting a photodiode PD by forming a pn junction with an n-type semiconductor substrate 100N, and $n^+$ regions 112 as an isolation region are formed on the first surface 100a (upper face in the drawing) side of the n-type semiconductor substrate. A metal wire 61 is electrically connected to its corresponding $p^+$ region 111. The metal wire 61 is formed on an insulating film 114 and is connected to the $p^+$ region 111 at a contact hole of the insulating film 114. A through wire 67 is also connected to the metal wire 61. The through wire 67 penetrates through the n-type semiconductor substrate 100N. The side wall of the through hole 67 through which the through wire 67 penetrates is formed with an insulating film 68 for electrically insulating the n-type semiconductor substrate 100N and the through wire 67 from each other. The insulating film 68 may be either a single layer film or multilayer film. On the second surface 100b side, a bonding pad 64 is connected to the through wire 67. On the rear side of the n-type semiconductor substrate 100 N, an $n^+$-type impurity layer 121 and an insulating protective layer 122 for protecting the surface are successively formed, whereas a bonding pad 69 is electrically connected to the $n^+$-type impurity layer 121 through a contact hole formed in the protective layer 122, thus forming an ohmic connection. Though omitted in this sectional view, switches SW are connected to the respective photodiodes.

Figure 10:
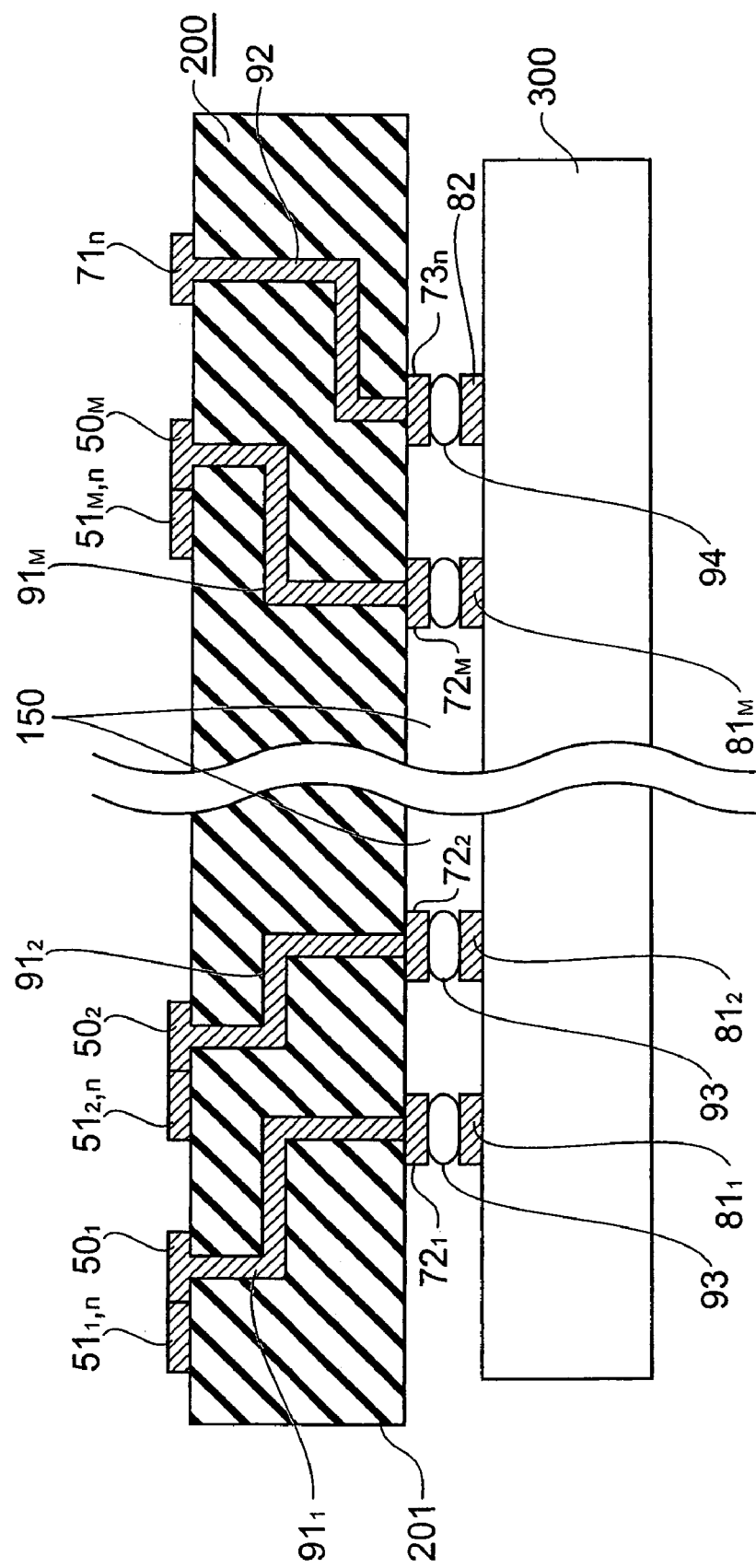
FIG. 10 is a view showing the structure of the second and third substrates in the photo-detecting apparatus shown in FIG. 1 at a cross section taken along the line X-X.

As shown in FIG. 10 illustrating a cross section taken along the line X-X of FIG. 1, the substrate 200 includes M ribbon-like metal wires $91_1$ to $91_M$ buried within a ceramic substrate 201. Each metal wire $91_m$ is connected to its corresponding common wire $50_m$ and bonding pad $72_m$. The metal wires $91_m$ are formed such that those adjacent to each other are arranged at a narrower interval on the second surface 200b side than on the first surface 200a side, so as to come closer to each other. This configuration arranges the bonding pads $72_m$ at an interval narrower than that of the common wires $50_m$, whereby the M bonding pads $72_m$ gather at the center part on the second surface 200b side. As a result, the outer peripheral size of the substrate 300 itself can easily be made smaller than that of the substrate 200. The ceramic substrate 201 further includes N ribbon-like metal wires 92 buried therein. Each metal wire 92 is connected to its corresponding bonding pads $71_n$ and $73_n$.

The gap between the substrates 100 and 200 is filled with a resin 150. As shown in FIG. 8, the bonding pads 51 and 64 are connected to each other by way of bumps 63 (first bumps). (The connection between the substrates 100 and 200 by the bumps 63 will hereinafter be referred to as first bump connection.) The first bump connection connects the photodiodes $PD_{m,n}$ in the substrate 100 to their corresponding common wires $50_m$ in the substrate 200. The bonding pads 66 and 71 are connected to each other by way of bumps 65.

The gap between the substrates 200 and 300 is also filled with the resin 150. As shown in FIG. 10, the bonding pads 72 and 81 are connected to each other by way of bumps 93 (second bumps). (The connection between the substrates 200 and 300 by the bumps 93 will hereinafter be referred to as second bump connection.) The second bump connection connects the signal processing circuits $60_m$ in the substrate 300 to their corresponding bonding pads $72_m$ in the substrate 200. The bonding pads 73 and 82 are connected to each other by way of bumps 94. Thus, the photo-detecting apparatus 1 has a three-dimensional mounting structure (which will hereinafter be referred to as three-dimensional bump connection structure) formed by the three substrates 100, 200, 300 connected by the first and second bump connections.

As shown in FIG. 8, a scintillator 510 and a shielding material 520 are arranged on the first surface 100a side of the substrate 100. The scintillator 510, which is disposed above the p⁺ regions 111 of the substrate 100, generates scintillation light in response to energy rays such as X-rays incident thereon. The shielding material 520, which is disposed above the n⁺ regions 112 of the substrate 100, prevents energy rays such as X-rays from passing therethrough and secures the scintillator 510.

The photo-detecting apparatus 1 having the foregoing structure operates as follows.

When an energy ray such as X-ray is incident on the scintillator 510, scintillation light corresponding to the energy ray is generated. The scintillation light is incident on the p⁺ regions 111 of the substrate 100, whereby, in the photodiodes PD, electric charges corresponding to the incident scintillation light is generated.

In parallel with the producing of electric charges by the photodiodes PD, the control circuit 40 (see FIG. 4) of the substrate 300 outputs SW opening/closing signals from the bonding pads 82 to the bonding pads 73 by way of the bumps 94 in the photo-detecting apparatus 1. The SW opening/closing signals are fed to the bonding pads 71 by way of the metal wires 92 within the substrate 200, and further to the metal wires 62 by way of the bumps 65, bonding pads 66, and through wires 67. By regulating the output of SW opening/closing signals, the control circuit 40 opens/closes the switches $SW_{m,n}$ of the substrate 100. Namely, the control circuit 40 outputs the SW opening/closing signals for the bonding pads $82_1$ to $82_N$, thereby simultaneously opening/closing M switches $SW_{1,1}$ to $SW_{M,1}$ each in respective columns connected to the metal wires $62_1$, $62_2$, ..., $62_N$ and repeating the operation of opening/closing the M switches $SW_{1,n}$ to $SW_{M,N}$ N times at fixed intervals.

This series of opening/closing operations for the switches SW causes the M photodiodes PD in each column to output electric charges corresponding to the incident scintillation light N times (the N times consisting of the output from the photodiodes $PD_{1,1}$ to $PD_{M,1}$, the output from the photodiodes $PD_{1,2}$ to $PD_{M,2}$, ..., and the output from the photodiodes $PD_{1,N}$ to $PD_{M,N}$). (In the following, each set of electric charges outputted from the M photodiodes PD in each column will be referred to as an electric charge group.)

By way of the metal wires 61, through wires 67, bonding pads 64, and bumps 63, the electric charge groups are fed to their corresponding bonding pads $51_{1,1}$ to $51_{M,N}$ connected to the M common wires $50_1$ to $50_M$ of the substrate 200. The electric charge groups are also fed to their corresponding metal wires $91_1$ to $91_M$ within the substrate 200 by way of the common wires $50_1$ to $50_M$, further to the bonding pads $81_1$ to $81_M$ by way of the bonding pads $72_1$ to $72_M$ and bumps 93, and from there to the M integrating circuits $10_m$. When the switches SWT of the integrating circuits $10_m$ are open, electric charges of the electric charge groups are accumulated in their corresponding capacitors C. Such operations are successively repeated N times. Then, each integrating circuit $10_m$ accumulates electric charges outputted from the N photodiodes $PD_{m,1}$ to $PD_{m,N}$ provided in its corresponding unit $U_m$. This allows the respective output terminals of the integrating circuits $10_1$ to $10_M$ to output voltages corresponding (proportional) to the electric charges accumulated in their capacitors C. Further, the CDS circuits $20_m$ on the substrate 300 output voltages indicative of changes in output voltages in the integrating circuits $10_m$ in a fixed time, whereas the hold circuits $30_m$ on the substrate 300 hold the voltages outputted from the CDS circuits $20_m$ for a predetermined period.

Since the substrate 200 including the common wires $50_m$ for connecting the photodiodes $PD_{m,n}$ to their corresponding signal processing circuits $60_m$ and the metal wires $91_m$ is interposed between the substrates 100 and 300 as in the foregoing, the photo-detecting apparatus 1 can shorten the length of wiring laid out on the substrates 100, 200. The substrates 100 and 200 are electrically connected to each other by the first bump connection, whereas the substrates 200 and 300 are electrically connected to each other by the second bump connection. Therefore, the photo-detecting apparatus 1 shortens electric charge migration paths from the photodiodes $PD_{m,n}$ in the substrate 100 to the integrating circuits $10_m$ in the substrate 300, and thus can lower the parasitic capacitance in the wiring on the paths and reduce the noise included in the output voltages from the respective integrating circuits $10_m$. As a consequence, the photo-detecting apparatus 1 can accurately detect light.

Figure 12:
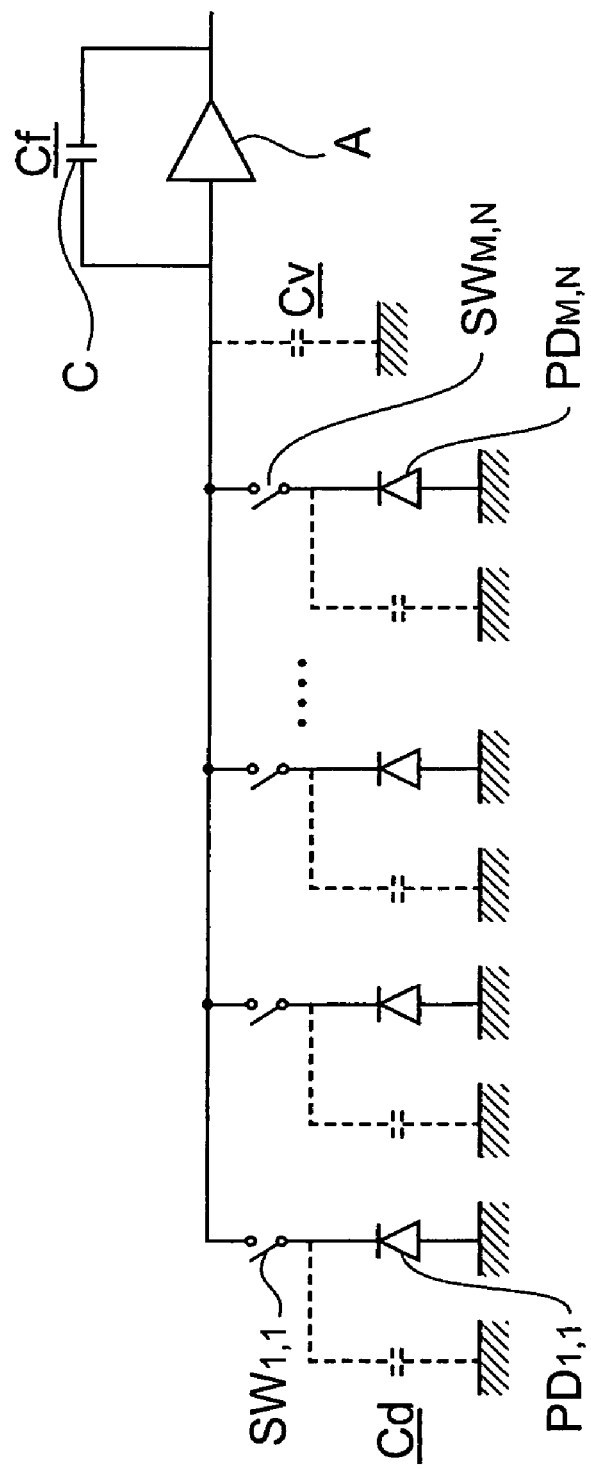
FIG. 12 is a circuit diagram showing a device generating a capacity in the photo-detecting apparatus shown in FIG. 1.

Meanwhile, as shown in FIG. 12, the noise Ns included in an output signal from the photo-detecting apparatus is inversely proportional to the capacitance Cf of the capacitor C in the integrating circuit, and is proportional to a capacity Ct which is the sum of the combined capacitance Cd and parasitic capacitance Cv of a plurality of photodiodes. Namely, Ns∝Ct/Cf, Ct=(Cd+Cv). Therefore, an increase in parasitic capacitance leads to an increase in noise Ns.

By contrast, since the substrates 100 and 300 are arranged such that the substrate 200 made of ceramic or the like is interposed therebetween, the photo-detecting apparatus 1 shortens the length of wiring laid out on the substrate 300 (silicon substrate), and thus can lower the parasitic capacitance Cv. Therefore, the noise included in the voltages outputted from the integrating circuits $10_m$ is low, whereby light can be detected accurately.

The substrate 200 is made of a ceramic substrate which is excellent in insulation. Therefore, the metal wires 91 within the ceramic substrate in the substrate 200 are electrically separated from each other. Consequently, by using a single substrate 200, the photo-detecting apparatus 1 can individually connect the photodiodes $PD_{m,1}$ to $PD_{m,N}$ included in a plurality of units $U_1$ to $U_m$ to their corresponding signal processing circuits $60_m$.

In the photo-detecting apparatus 1, the substrate 300 is made smaller than each of the substrates 100 and 200, whereas the substrate 100 is formed with PD arrays, though not the substrate 100 but the substrate 300 is provided with the signal processing circuits $60_m$ for processing the signals outputted from the PD arrays. Therefore, a plurality of substrates 100 can be arranged with a narrowed gap therebetween such that the substrates 100 are positioned very close to each other or in contact with each other. Consequently, the photo-detecting apparatus 1 can increase the number of pixels and achieve a higher density.

The photo-detecting apparatus 1 is also preferred in that the substrate 100 formed with the PD arrays and the substrate 300 formed with the signal processing circuit $60_m$ can be made by their respective optimal manufacturing processes.

This example of the photo-detecting apparatus according to the present invention is also advantageous over the conventional photo-detecting apparatus disclosed in the above-mentioned Document 1 in the following points. Namely, the conventional photo-detecting apparatus connects the first and second substrates by wire bonding, and thus cannot arrange a scintillator above a pad for wire bonding when arranging the scintillator on the first substrate. If a scintillator is arranged, its form must be made different from others. Therefore, when a plurality of first substrates are arranged in the conventional photo-detecting apparatus, photodiodes within the respective substrates fail to attain a uniform photo-detecting sensitivity. Also, when a plurality of first substrates are arranged in the conventional photo-detecting apparatus, second substrates are placed beside the first substrates (i.e., a second substrate is placed between the first substrates neighboring each other), so that the photodiodes in the respective first substrates cannot be arranged at a uniform pitch.

By contrast, since the substrates 200 and 300 are connected to each other by the second bump connection, the photo-detecting apparatus according to the present invention can make all the scintillators have the same form. Also, the substrate 300 can be made smaller than the substrate 200, so that the substrates can be laid out substantially with no gaps, whereby photodiodes in a plurality of substrates 100 can be arranged with a uniform pitch.

Figure 9:
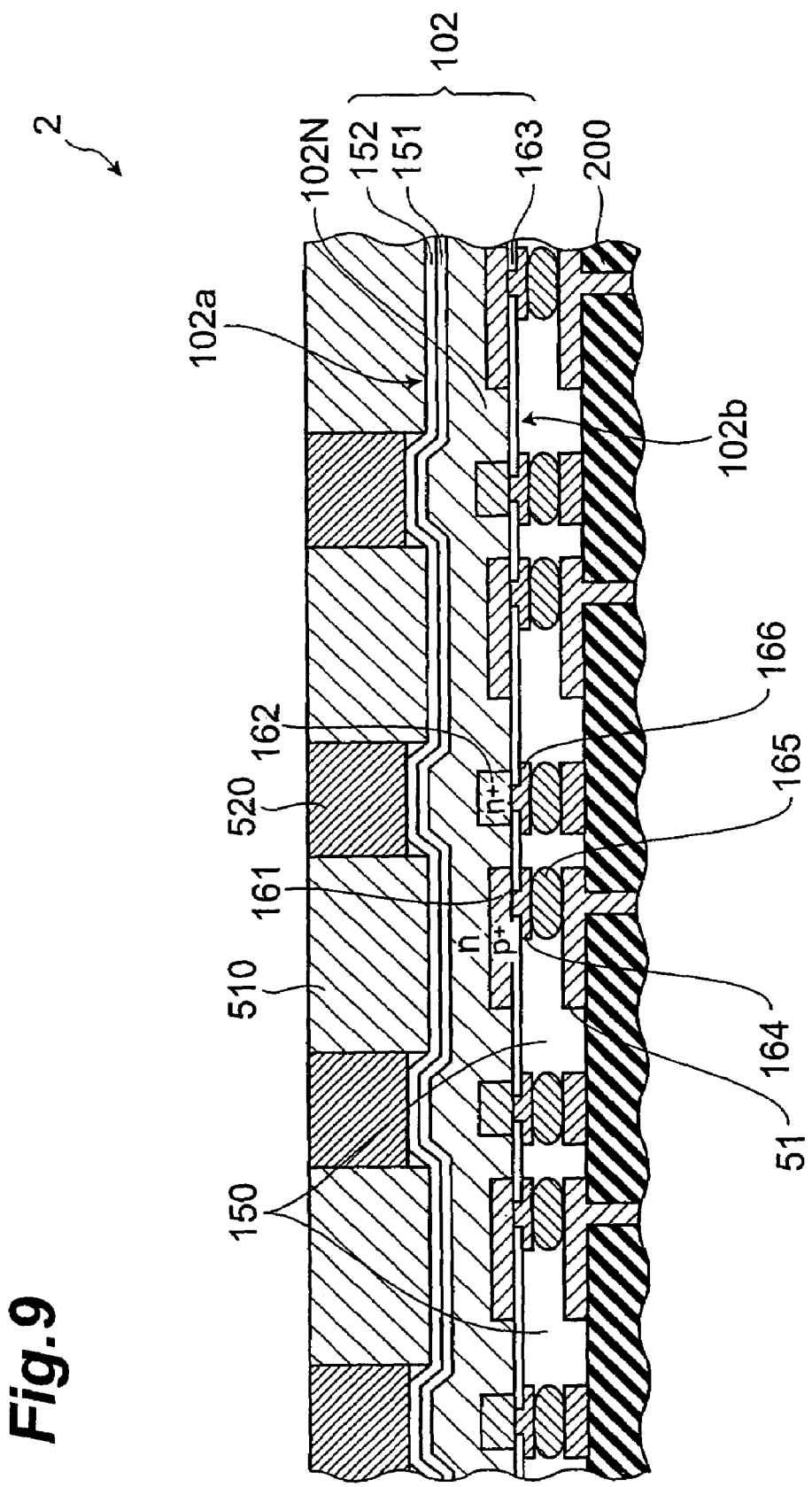
FIG. 9 is a view showing a second cross-sectional structure between the first and third substrates in the photo-detecting apparatus shown in FIG. 1 (second example)

FIG. 9 is a view showing a second cross-sectional structure of substrates 102 and 200 which are first and third substrates, respectively, as a second example of the photo-detecting apparatus according to the present invention. Since the photo-detecting apparatus 2 according to the second example and the photo-detecting apparatus 1 according to the above-mentioned first example differ from each other in the structure of the first substrate but are the same in terms of the structure of the substrates 200 and 300 (third and second substrates), the substrate 102 will mainly be explained in the following while omitting or simplifying the explanation of the substrates 200 and 300. Since a basic pattern is also laterally repeated in FIG. 9, only one basic pattern will be explained in the following.

In the substrate 102 acting as the first substrate, an $n^+$-type accumulation layer 151 for preventing electric charges from being recombined and an insulating protective layer 152 for protecting the surface are formed on the first surface 102a side of an n-type semiconductor substrate. On the second surface 102b side, the substrate 102 is formed with $p^+$ regions 161 each constituting a photodiode PD by forming a pn junction with the n-type semiconductor substrate 102N, $n^+$ regions 162 acting as an isolation region, and a protective layer 163 for covering them. On the second surface 102b side, bonding pads 164 electrically connected to the respective $p^+$ regions 161 are formed, whereas bumps 165 are connected to the respective bonding pads 164. The bumps 165 are connected to the respective bonding pads 51 in the substrate 200. The gap between the substrates 102 and 200 is filled with a resin 150. Bonding pads 166 are formed in the respective $n^+$ regions 162.

A scintillator 510 and a shielding material 520 are arranged on the first surface 102a side of the substrate 102. In the scintillator 510 disposed above the $p^+$ regions 161 of the substrate 102, scintillation light is generated in response to energy rays such as X-rays incident thereon. The shielding material 520, which is disposed above the $n^+$ regions 162 of the substrate 102, prevents energy rays such as X-rays from passing therethrough and secures the scintillator 510. The substrate 102 is etched on the first surface side at a part formed with the $p^+$ regions 161, so as to become thinner there.

When an energy ray such as X-ray is incident on the scintillator 510 in the photo-detecting apparatus 2 (FIG. 9) according to the second example, scintillation light is generated. When the scintillation light is transmitted through the substrate 102 from the first surface side so as to be made incident on the $p^+$ regions 161, electric charges are generated by photodiodes on the second surface 102b side opposite from the first surface 102a. The electric charges are fed to the substrate 200 by way of the bonding pads 164 and bumps 165. Since then, the photo-detecting apparatus 2 accumulates electric charges into capacitors C in integrating circuits 10 as with the photo-detecting apparatus 1 according to the first example mentioned above. Then, output terminals of the integrating circuits 10 output voltages corresponding to the electric charges accumulated in the capacitors C.

Since the substrates 102, 200, 300 in the photo-detecting apparatus 2 according to the second example are connected together by the first and second bump connections as in the photo-detecting apparatus 1 according to the first example, the electric charge migration paths from the photodiodes $PD_{m,n}$ in the substrate 100 to the integrating circuits $10_m$ in the substrate 300 are shortened. This can lower the parasitic capacitance in the wiring on the paths, thereby reducing the noise included in the output voltages from the respective integrating circuits $10_m$. Consequently, the photo-detecting apparatus 2 can also detect light accurately. The photo-detecting apparatus 2 exhibits the other operations and effects as with the photo-detecting apparatus 1 according to the first example.

Figure 11:
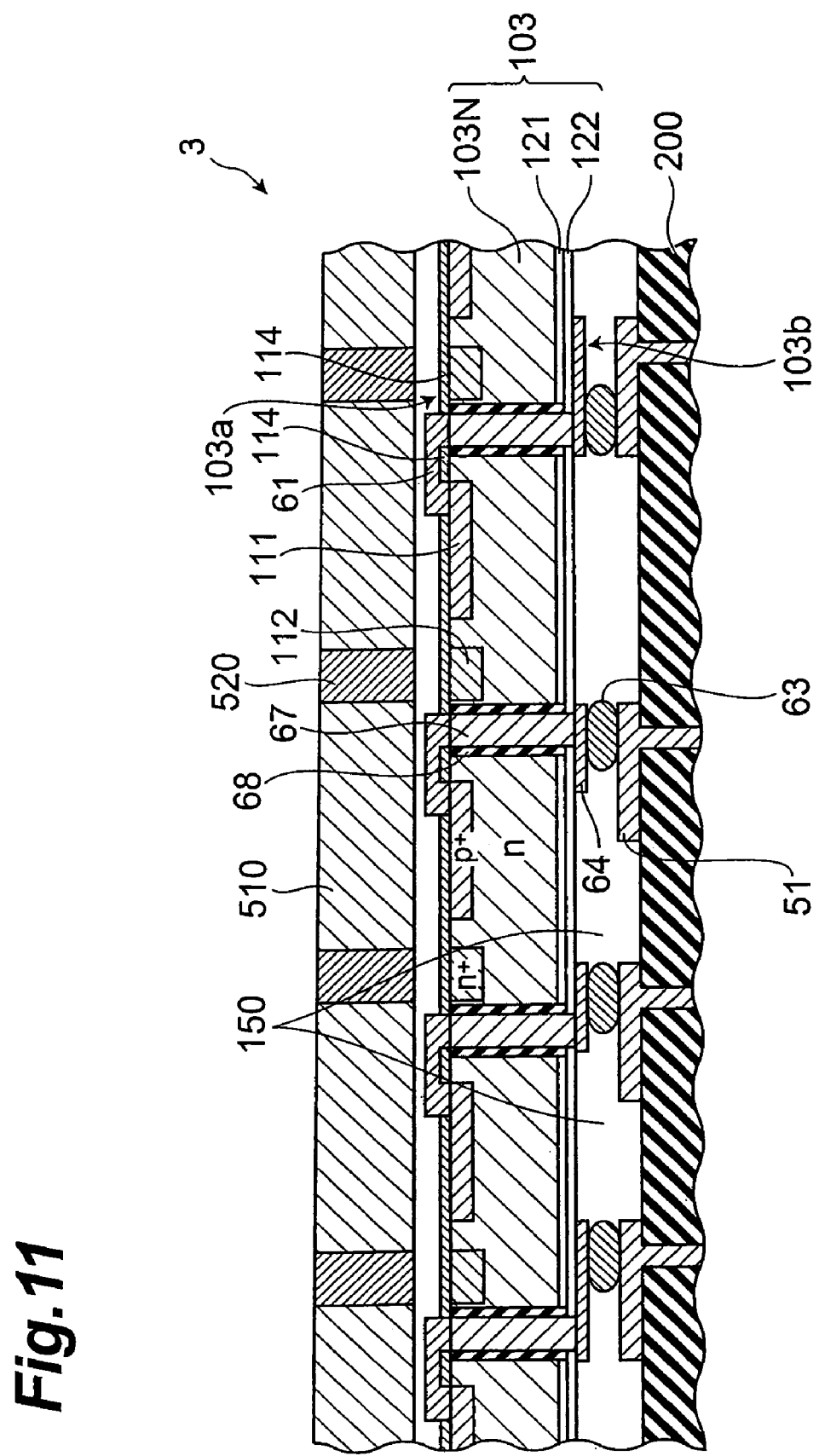
FIG. 11 is a view showing a third cross-sectional structure of the first and third substrates in the photo-detecting apparatus shown in FIG. 1 (third example)

FIG. 11 is a view showing a third cross-sectional structure of substrates 103 and 200 which are first and third substrates, respectively, as a third example of the photo-detecting. apparatus according to the present invention. The substrate 103 shown in FIG. 11 differs from the substrate 100 in the first example in that each of the interval at which the bumps 64 are arranged on the second surface 103b side and the interval at which the bonding pads 51 are arranged in the substrate 200 is shorter than the interval at which the photodiodes PD are arranged on the first surface 103a side of an n-type semiconductor substrate 103N. The bonding pads 64 are formed longer from the position connecting with the through wires 67 to the position connecting with the bumps 63 as necessary. The side wall of each through hole through which the through wire 67 penetrates is formed with an insulating film 68 for electrically insulating the substrate 103 and through wire 67 from each other. The insulating film 68 may be either a single layer film or multilayer film. The bonding pads 69 are arranged as with the bonding pads 51. The bumps 63, the boding pads 64 and the bonding pads 51 constituting the first bump connection may be arranged at an interval shorter than the interval at which the photodiodes PD are arranged in the substrate 100 acting as the first substrate in the photo-detecting apparatus 1 according to the first example shown in FIG. 8 as well.

Without being restricted to the examples mentioned above, the present invention can be modified in various manners. For example, the respective cross-sectional structures of the first substrate (substrates 100, 102, 103) and third substrate (substrate 200) are not limited to those shown in FIGS. 8, 9, and 11. The second substrate (substrate 300) may further be provided with other circuits such as an A/D converter circuit for A/D conversion of output voltages from the hold circuits $30_m$, for example.

Though a ceramic substrate is explained as the third substrate (substrate 200) in the above-mentioned examples, the third substrate is not limited to ceramic substrates as long as it is formed from an insulating material. For example, it may be a substrate made of glass, organic materials such as polyimide, and their composite materials.

Though bumps are used for connecting the first substrate (substrates 100, 102, 103) and third substrate (substrate 200) to each other or the third substrate (substrate 200) and second substrate (substrate 300) to each other in the above-mentioned examples, solder or a combination of a bump with an anisotropic conductive film ACF, anisotropic conductive resin ACP, or nonconductive resin NCP may be employed.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

Since the wiring third substrate made of an insulating material is interposed between the first substrate arranged with a photodiode and the second substrate arranged with a signal processing circuit, the present invention can shorten the wiring length on the first or second substrate, and thus is employed in a photo-detecting apparatus whose parasitic capacitance is low in the wiring on electric charge migration paths.

The invention claimed is:

1. A photo-detecting apparatus comprising:
a first substrate having a surface provided with a plurality of photodetector devices;
a second substrate having a surface provided with a signal processing part for processing output signals of said photodetector devices; and
a third substrate, provided between said first and second substrates, having a first surface opposing said first substrate and a second surface opposing said second substrate; said third substrate including: a common wire, arranged on said first surface, electrically connected to said photodetector devices; and a terminal part, arranged on said second surface, electrically connected to said common wire on the first surface and said signal processing part,
wherein said common wire on said first surface of said third substrate includes a plurality of wiring elements arranged at a predetermined interval, and
wherein said terminal part on said second surface of said third substrate includes a plurality of terminals arranged at an interval narrower than the interval at which said plurality of wiring elements are arranged,
wherein said first substrate comprises a plurality of switches each electrically connected to the associated photodetector device, and
wherein said photo-detecting apparatus comprises a control part for successively opening/closing said plurality of switches.

2. A photo-detecting apparatus according to claim 1, further comprising a first bump, provided between said first and third substrates, for electrically connecting each of said photodetector devices to said common wire, and a second bump, provided between said second and third substrates, for electrically connecting said signal processing part to said terminal part.

3. A photo-detecting apparatus according to claim 1, wherein said third substrate has a structure such that an inner wire connecting said common wire to said terminal part is buried within a ceramic substrate.

* * * * *